(12) United States Patent
Chang et al.

(10) Patent No.: US 7,259,084 B2
(45) Date of Patent: Aug. 21, 2007

(54) GROWTH OF GAAS EPITAXIAL LAYERS ON SI SUBSTRATE BY USING A NOVEL GESI BUFFER LAYER

(75) Inventors: Edward Y. Chang, Taipei (TW); Guangli Luo, Hsinchu (TW); Tsung Hsi Yang, Shui Lin Village (TW); Chung Yen Chang, Hsinchu (TW)

(73) Assignee: National Chiao-Tung University, Hsinchu (TW)

( * ) Notice: Subject to any disclaimer, the term of this patent is extended or adjusted under 35 U.S.C. 154(b) by 367 days.

(21) Appl. No.: 10/699,839

(22) Filed: Nov. 4, 2003

(65) Prior Publication Data

US 2005/0023552 A1     Feb. 3, 2005

(30) Foreign Application Priority Data

Jul. 28, 2003   (TW) ............................... 92120501 A
Jul. 28, 2003   (TW) ............................... 92120502 A

(51) Int. Cl.
*H01L 21/28*     (2006.01)

(52) U.S. Cl. ...................... 438/604; 438/602; 438/606; 257/E21.127; 257/E21.461

(58) Field of Classification Search ................ 257/233, 257/235, 297, E21.127, E21.461; 438/406, 438/407, 455, 456, 458, 459, 910, 602, 604, 438/606
See application file for complete search history.

(56) References Cited

U.S. PATENT DOCUMENTS 5,141,893 A     8/1992  Ito et al.

(Continued)

FOREIGN PATENT DOCUMENTS

TW     092120501     7/2003

(Continued)

OTHER PUBLICATIONS

J. A. Carlin et. al., *Impact of GaAs buffer thickness on electronic quality of GaAs grown on graded Ge/GeSi/Si substrates*, Apr. 2000, American Institute of Physics, Applied Physics Letters, vol. 76, No. 14, pp. 1884-1886.

(Continued)

*Primary Examiner*—Andy Huynh
(74) *Attorney, Agent, or Firm*—Bacon & Thomas, PLLC

(57) ABSTRACT

This invention provides a process for growing Ge epitaxial layers on Si substrate by using ultra-high vacuum chemical vapor deposition (UHVCVD), and subsequently growing a GaAs layer on Ge film of the surface of said Ge epitaxial layers by using metal organic chemical vapor deposition (MOCVD).

The process comprises steps of, firstly, pre-cleaning a silicon wafer in a standard cleaning procedure, dipping it with HF solution and prebaking to remove its native oxide layer. Then, growing a high Ge-composition epitaxial layer, such as $Si_{0.1}Ge_{0.9}$ in a thickness of 0.8 μm on said Si substrate by using ultra-high vacuum chemical vapor deposition under certain conditions. Thus, many dislocations are generated and located near the interface and in the low of part of $S_{i01}Ge_{0.9}$ due to the large mismatch between this layer and Si substrate.

Furthermore, a subsequent 0.8 μm $Si_{0.05}Ge_{0.95}$ layer, and/or optionally a further 0.8 μm $Si_{0.02}Ge_{0.98}$ layer, are grown. They form strained interfaces of said layers can bend and terminate the propagated upward dislocation very effectively. Therefore, a film of pure Ge is grown on the surface of said epitaxial layers.

Finally, a GaAs epitaxial layer is grown on said Ge film by using MOCVD.

13 Claims, 3 Drawing Sheets

U.S. PATENT DOCUMENTS

| | | | |
|---|---|---|---|
| 5,183,776 | A | 2/1993 | Lee |
| 5,238,869 | A | 8/1993 | Shichijo et al. |
| 5,308,444 | A | 5/1994 | Fitzgerald, Jr. et al. |
| 5,438,951 | A | 8/1995 | Tachikawa et al. |
| 5,473,174 | A | 12/1995 | Ohsawa |
| 5,879,962 | A | 3/1999 | DePuydt et al. |
| 5,959,308 | A | 9/1999 | Shichijo et al. |
| 6,107,635 | A | 8/2000 | Palathingal |
| 6,291,321 | B1 | 9/2001 | Fitzgerald |
| 6,893,936 | B1 * | 5/2005 | Chen et al. ................. 438/407 |
| 2004/0031979 | A1 * | 2/2004 | Lochtefeld et al. |

FOREIGN PATENT DOCUMENTS

| | | |
|---|---|---|
| TW | 092120502 | 7/2003 |

OTHER PUBLICATIONS

R. D. Bringans et. al., *Use of ZnSe as an interlayer for GaAs growth on Si*, Jul. 1992, American Institute of Physics, Applied Physics Letters, vol. 61, No. 2, pp. 195-197.

J. Arokiaraj et. al., *High-quality GaAs on Si substrate by the epitaxial lift-off technique using $SeS_2$*, Dec. 1999, American Institute of Physics, Applied Physics Letters, vol. 75, No. 24, pp. 3826-3828.

C. Kadow et. al., *Subpicosecond carrier dynamics in low-temperature grown GaAs on Si substrates*, Oct. 1999, American Institute of Physics, Applied Physics Letters, vol. 75, No. 17, pp. 2575-2577.

Y. R. Xing et. al., *Growth of high quality gallium arsenide on HF-etched silicon (001) by chemical beam epitaxy*, Apr. 1993, American Institute of Physics, Applied Physics Letters, vol. 62, No. 14, pp. 1653-1655.

Michael Y. Frankel et. al., *Integration of low-temperature GaAs on Si substrates*, Jan. 1993, American Institute of Physics, Applied Physics Letters, vol. 62, No. 3, pp. 255-257.

* cited by examiner

GROWTH OF GAAS EPITAXIAL LAYERS ON SI SUBSTRATE BY USING A NOVEL GESI BUFFER LAYER

BACKGROUND OF THE INVENTION

1. Field of the Invention

This invention relates to a process for manufacturing semiconductor structure or devices, more particular for growing a high quality Ge film on Si substrate using a novel GeSi buffer method and additionally growing a high quality Group III-V, such as GaAs epitaxial layer on the grown Ge/SiGe/Si substrate.

2. Description of Related Art

The growth of high quality GaAs or other III-V compound semiconductors on silicon substrate is recognized as a desirable goal for the fabrication of advanced semiconductor devices. Specific advantages of this combination of materials include the availability of GaAs with high electron mobility and optical activity on a silicon substrate with improved mechanical strength and thermal conductivity over that obtainable with GaAs substrate. In addition, the growth of high quality GaAs on silicon offers the possibility of monolithically integrating GaAs and silicon devices for advanced electronic components.

However, one of the key limitations in the implementation of device structure based on heteroepitaxial GaAs on silicon has a 4.0% difference in lattice constant and additional intrinsic thermal conductivity difference between the two different materials. This lattice mismatch leads to the formation of a network of misfit dislocation at the heterointerface and high density threading dislocation in the epitaxial layers.

Presently public techniques to overcome the defects produced from the growth of GaAs on Si substrate include varying epitaxial growth conditions for directly growing GaAs epitaxy on Si, applying strained supper lattices buffer to filter threading dislocation and using Ge composition graded SiGe layers as buffer.

For example, the techniques for directly growing GaAs epitaixial layer on Si, for the purpose of lowering the large threading dislocation due to lattice mismatch of GaAs on Si substrate, two steps of annealing methods or strained superlatticed buffer are previously applied to solve those problems. Related disclosures include U.S. Pat. Nos. 5,959,308, 5,879,962, 5,473,174, 5,308,444, 5,438,951, 5,238,869, 5,183,776 and 5,141,893, furthermore, it is reported in "Subpicosecond carrier dynamics in low-temperature grown GaAs on Si substrates" (Applied Physics Letters, Vol. 75, No. 17, 25 Oct. 1999) from A. C. Gossard et al., and in "Growth of high quality gallium arsenide on HF-etched silicon by chemical beam epitaxy" (Applied Physics Letters, Vol. 62, No. 14, 5 Apr. 1993) from P. J. Goodhew et al., and in "Integration of low-temperature GaAs on Si substrates" (Applied Physics Letters, Vol. 62, No. 3, 18 Jan. 1993) from T. F. Carruthers et al. These prior arts have less effects on lowering the threading dislocation density according to the techniques for production from the directly growing GaAs on Si, wherein the threading dislocation density is generally about $10^8/cm^2$, and further reduced to about $10^7/cm^2$ with an additional annealing. Furthermore, due to large difference between thermal expansion coefficient of GaAs and that of Si, it is difficult to remove the additional dislocation induced during annealing, thus, these arts obviously are not deemed to be used for fabricating of high performance device.

Furthermore, the technique which uses interlayer as buffer for growing GaAs on Si, that is, a structure of GaAs/interlayer/Si, as we know the interlayer can include $SeS_2$, ZnSe or STO film. For example, an bonding technique disclosed in "High-quality GaAs on Si substrate by the epitaxial lift-off technique using $SeS_2$" (Applied Physics Letters, Vol. 75, No. 24, 13 Dec. 1999) from M. Umeno et al., which describes that a GaAs wafer is bonded to silicon substrate using $SeS_2$ as the interlayer and the desirable GaAs layer is acquired by applying the lift-off technique. However, these arts obviously make some problems, such as high fabricating cost and no large scale of GaAs epitaxy on Si substrate to be obtained.

And, the reference "Use of ZnSe as an interlayer for GaAs growth on Si" (Applied Physics Letters, Vol. 61, No. 2, 13 Jul. 1992) from J. C. Tramontana et al. is reported that ZnSe is used as the interlayer for growing GaAs epitaxy on Si, i.e., the interlayer has a structure of GaAs/ZnSe/Si. However, it is difficult to grow a high quality ZnSe on Si, and the small thermal conductivity of ZnSe is disadvantageous for fabricating of device, thus, the utilization of this invention is in the presence of some problems to be solved.

In addition, it is reported in "New research yield epitaxial grown GaAs on Si" (Solid State Technology, 45, 61 2002) from K. Esenbeiser et al., which discloses the use of STO film as the interlayer for growing GaAs epitaxy on Si, i.e., a structure of GaAs/STO film/Si. However, it is with high fabricating cost and low productivity for growth by applying molecule beam epitaxy (MBE), and additionally it is with small thermal conductivity of STO film, which is disadvantageous for heat diffusion of device, thus, the utilization of this invention totally is in the presence of some problems to be solved, too.

As for applying the technique in using Ge composition graded buffer for growing SiGe epitaxy, which is disclosed in "Novel dislocation structure and surface morphology effects in relaxed Ge/SiGe(graded)/Si structures" from E. A. Fitzgerald et al. mentioned above, wherein graded $Si_{1-x}Ge_x$ is applied as interlayer for the growth of GaAs epitaxy on Si due to almost the same lattice constant and thermal expansion coefficient for the two different materials, this technique has comparatively wide field in application, but is also in the presence of some problems to be overcome. That is, applying the concept of gradually increasing Ge content of SiGe epitaxy, since the Ge composition starts from zero to a very high value and herein forms the crosshatch pattern, where the pattern brings a very high surface roughness. As for growing under the condition that the Ge epitaxial layer is 6 degree oriented to silicon substrate, the roughness is over 150 Å; comparatively, it gains a surface roughness of over 450 Å for growing without degrees. Wherein, high surface roughness due to thick epitaxial layer and cross hatch pattern will increase the fabrication cost of epitaxy and cause difficulties in device producing. As for removing cross hatch pattern, chemical-mechanical polishing (CMP) is subjected to solve these problems in above-mentioned references and patents, but it increases additional cost and causes difficulties in processing substantially.

SUMMARY OF THE INVENTION

A first object of this invention is to solve hereinabove problems, as for growing Ge epitaxy on Si by using a novel method, including how to lower the thickness of Ge epitaxial layers, to flatten the surface roughness induced from high Ge-composition epitaxial layers without help of CMP, and to lower the high defects density due to lattice mismatch.

The epitaxial semiconductor structure has been disclosed in relevant patents and references from E. A. Fitzgerald et al., wherein the structure contains a Ge composition graded buffer layer and a Ge-composition uniform layer, however it is with a total epitaxial layer thickness of over 10 µm. The process disclosed herein is on a silicon substrate, which a first Ge composition graded SiGe epitaxial layer on said substrate is grown by using molecular beam epitaxy (MBE) or ultra-high vacuum chemical vapor deposition, generally at a grading rate of 10% Ge composition per µm of layers and gradually reaching to 50% of Ge composition, then the surface of said layers is planarized by using chemical-mechanical polishing (CMP). Herein the thickness of the first layer is about 5 µm. Subsequently, a second layer comprising Ge composition from 50% to 75% is grown and a further planarizing the surface of said second layer by using CMP is performed. Herein the thickness of the second layer is about 2.5 µm. Having grown a high Ge-composition third layer, it needs to vary the epitaxial growth conditions including to lower the growth temperature and partial pressure of growth gases, herein the thickness of said third layer is above 2.5 µm. According to the foregoing process, the product of best mode is a epitaxy layer with no surface cracking, threading dislocation density of about $10^6/cm^2$, particles density on surface of about $150/cm^2$, roughness of 24 nm and a total epitaxial layer thickness of at least 10 µm.

The conception of the process for this invention is, firstly growing a high Ge-composition epitaxial layer, such as $Si_{0.1}Ge_{0.9}$ in a thickness of 0.5~0.8 µm on Si substrate, in which many dislocations are generated and located near the interfaces and in the low of part of this layer due to the large mismatch between this layer and Si substrate. Subsequently growing two or three layers of more high Ge-composition epitaxial layers, such as $Si_{0.05}Ge_{0.95}$ and/or $Si_{0.02}Ge_{0.98}$ in a thickness of 0.5~0.8 µm. The formed strained interfaces between said layers can bend and terminate the propagated upward dislocation from the first layer very effectively. Then, growing a final film of pure Ge on here epitaxial layer and a total epitaixial thickness is of only several micrometers, such as below 3 micrometer.

The in-situ high temperature annealing for each layer is performed in growing process therein, and carried out under the temperature of from 650 to 800° C., and 15~30 minutes to further promote the quality of single crystalline of the Ge film.

Compared to the study of E. A. Fitzgerald et al., the invention applying high Ge content, such as initial $Si_{0.1}Ge_{0.9}$ layer as the first layer SiGe epitaxial layer and then providing further high Ge-composition layers, such as a layer of $Si_{0.05}Ge_{0.95}$ and/or an optional $Si_{0.1}Ge_{0.9}$ layer, is for the purpose of applying the formed strained interfaces between the said layers to bend and terminate the propagated upward dislocation from the first layer. Thus, this invention has apparently different conception from prior arts having growing pattern of Ge composition graded at a constant grading rate of 5% or 10% from zero to 100% and that will be at least 10 µm in thickness of a total SiGe epitaxial layers according to the grading rate herein. However, it is of high possibility for this invention to have a total thickness of below 3 µm.

BRIEF DESCRIPTION OF THE INVENTION

Figure 1:
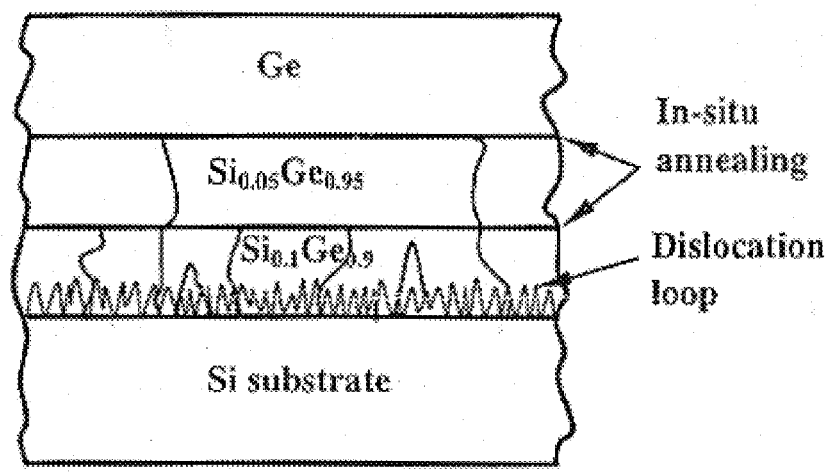
FIG. 1 is a schematic diagram of this invention for growing mechanism of Ge epitaxy on Si substrate, which shows the conception that the strained interface blocks the threading dislocation to be generated and locks that dislocation near the interface.
Figure 2:
FIGS. 2 and 3 are cross-sectional (XTEM) and plane-view transmission electronic microscope micrographs of the sample according to this invention, wherein the sample obtained has a total thickness SiGe epitaxial layers of about 2.6 µm., threading dislocation density of about $3\times10^6/cm^2$ on the top Ge layer, and surface roughness of 3.2 nm.
Figure 3:
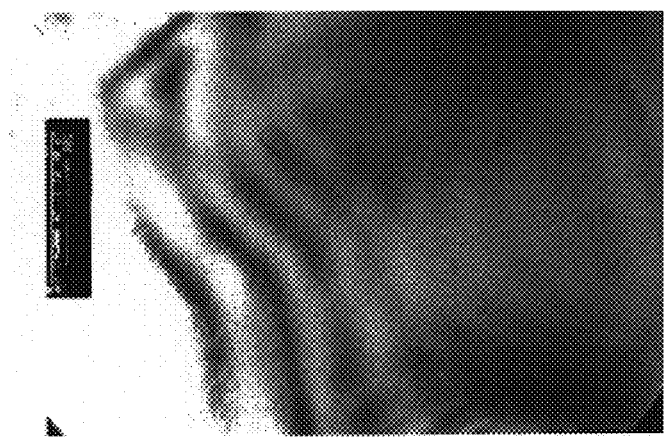
Figure 4:
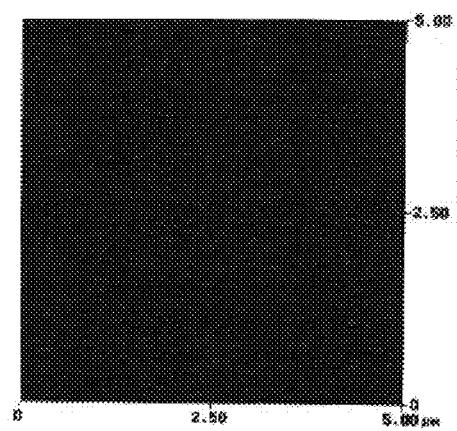
FIG. 4 is the analysis of the atomic force microscope micrograph of the surface roughness of the sample according to this invention, which shows the sample having a very smooth surface.

This process for the growth of SiGe epitaxy, which is based upon ultra-high vacuum chemical vapor deposition and using $SiH_4/Si_2H_6$, $GeH_4$ as growth gases, is carried out at a temperature ranging from 350° C. to 650° C. and a pressure ranging from 20 m-Torr to 100 m-Torr for growth gases herein, and whatever a first, a second and/or an optional third layers grown is under the same conditions except the feeding flow of either $SiH_4/Si_2H_6$ or $GeH_4$. The low temperature growing for Ge epitaxy is to prevent island formation and downgrade the quality of Ge epitaxy, and further, the pressure is to control the growing velocity for Ge epitaxy, and both factors including temperature and pressure are preferably kept constant. However, those prior arts for growth of Ge composition graded epitaxial layers, in order to keep the Ge grading rate at a constant, it must be controlled carefully to increase Ge content. For example, to reduce the threading dislocation density of said layers, lower a grading rate for Ge content is selected and more thickly a total epitaxy thickness is formed. In another aspect, if a higher grading rate, such as more than 10% of Ge composition per micrometer of layers is selected, it will fast increase the threading dislocation density.

Prior arts further comprise planarization for each epitaxial layer after per growth cycle, said planarization such as chemical-mechanical polishing is to eliminate the surface roughness prior to a next layer on said surface. However, without very complicated work sequence like that, this invention more particularly allows to provide a surface having more equivalently smooth-faced than that is planarized by using CMP, this invention achieves that by means of different dislocation reducing mechanism as described above.

A second object of this invention is to solve the problems in prior arts, which concerns the growth of GaAs epitaxial layers on silicon substrate by using interlayer, more particularly using $Si_{1-x}Ge_x$ as buffer.

With respect to the techniques for GaAs grown on Si using $Si_{1-x}Ge_x$ as buffer, it is reported in "Impact of GaAs buffer thickness on electronic quality of GaAs grown on graded Ge/SiGe/Si substrate" (Applied Physic Letters, Vol. 76, No. 14, 3 Apr. 2000) from E. A. Fitzgerald et al., they use Ge composition graded buffer layers to grow SiGe epitaxy on silicon wafer, and apply molecule beam epitaxy (MBE) to grow an GaAs epitaxial layer on uppermost Ge film of said SiGe epitaxy, wherein the techniques for $Si_{1-x}Ge_x$ grown on Si has been disclosed in U.S. Pat. No. 6,291,321, 6,107,653 from E. A. Fitzgerald et al., and besides, the techniques for growing a GaAs epitaxial layer on Ge applying MBE has been disclosed in U.S. Pat. No. 5,308,444 from Jeng-Ming Kuo et al. Therein is a semiconductor structure comprising a SiGe epitaxial layer which has a Ge composition grading from zero to 100% and having low dislocation density in said layers, it is of a total epitaxial layer thickness of about 10 µm. The final step of the process is to grow a thickness of about 2.5 µm of GaAs on latest Ge film by using MBE.

For overcoming the problems resulted from the growth of GaAs on Si by using Ge graded $Si_{1-x}Ge_x$ as buffer, the invention provides a different solution to grow the epitaxial layers having reduced total thickness, smoother surface and lower defects density.

The conception of the process for this invention is, firstly growing a high Ge-composition epitaxial layer, such as $Si_{0.1}Ge_{0.9}$ in a thickness of 0.5~0.8 μm on Si substrate, in which many dislocations are generated and located near the interface and in the low of the part of this layer due to large mismatch between this layer and Si substrate. Subsequently growing two or three layers of more high Ge-composition epitaxial layers, such as $Si_{0.05}Ge_{0.95}$ and/or $Si_{0.02}Ge_{0.98}$ in a thickness of 0.5~0.8 μm. The formed strained interfaces of said layers can bend and terminate the propagated upward dislocation from the first layer very effectively. Then, growing a film of pure Ge on herein epitaxial layer, and a total epitaixial thickness being of only several micrometers, such as below 3 micrometer. Finally, growing a GaAs epitaxial layer in a certain thickness on said Ge film by using metal organic chemical vapor deposition (MOCVD), wherein the thickness of epitaxial GaAs depending upon the properties required for the fabrication of devices may be 1 to 3 μm in thickness. Therefore, according to the invention, the thickness of a total epitaxial SiGe layer neglecting the additional GaAs layer, allows to be limited below 3 μm substantially.

Figure 5:
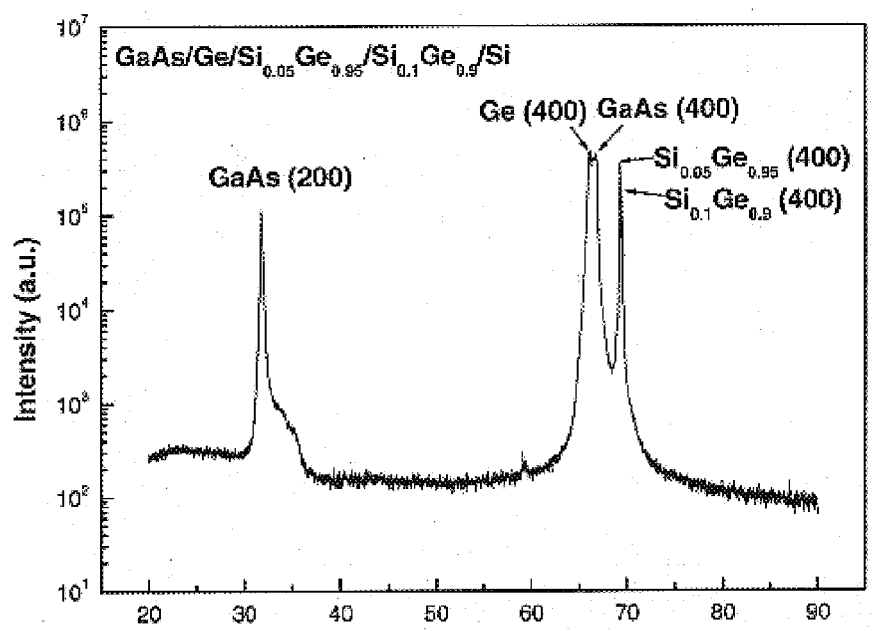

FIG. 5 is a XRD micrograph of the GaAs/SiGe/Si epitaxial layer sample according to this invention, wherein the sample is obtained with a very high quality for single crystalline.

Figure 6:
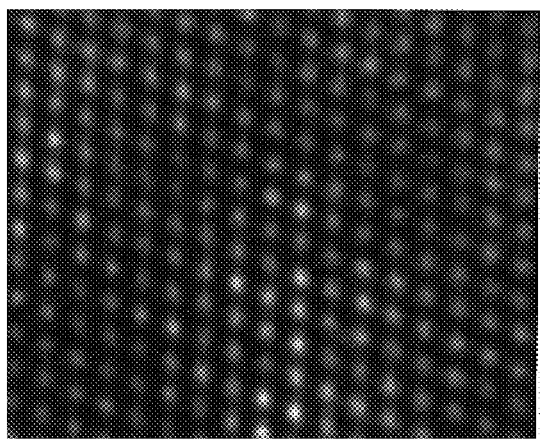

FIG. 6 is a cross-sectional transmission electronic microscope (XTEM) micrograph of the sample according to this invention, and also shows a very good single crystalline quality.

Another object of the invention is to be used in fabrication of high-speed devices and optical devices based on Ge/Si and GaAs/Ge/Si materials, such as Ge MOSFET combined with high-k gate material, Ge photodetector, GaAs HBT, MESFET, HEMET, LED, Laser etc, and future possible integrate of IV and III-IV devices on the same Si wafer.

DETAILED DESCRIPTION OF THE PREFERRED EMBODIMENT

The invention will be now illustrated in the following example but not be limited to.

Firstly, pre-cleaning the silicon wafer in a standard cleaning procedure, wherein the cleaning treatment comprises steps of boiling the silicon wafer in a solution containing the mixtures of $H_2O_2$, $H_2SO_4$ with the ratio 1:4 in about 10 min., then taking and rinsing it with de-ion water in 10 min., furthermore dipping it in a solution of 10% HF in 30 seconds and subsequently further taking and rinsing it into de-ion water. loading the wafer into a UHVCVD system immediately after said cleaning and prebaking the wafer at 850° C. in 10 min to remove the native oxided layer and then cooling the temperature of UHVCVD system down to 400° C. While temperature of system present stable and is capable of growing a high Ge-composition SiGe epitaxial layer. Wherein UHVCVD system is a quartz tube furnace equipped with heating sources, and the background is vacuumed by a molecular pump to a pressure of lower than $5\times10^{-8}$ torr. Growth gases including $SiH_4$ and $GeH_4$, which regulated by mass flow controller (MFC) to adjust the feeding flows of the gases. Wherein the flows supply of $SiH_4$ is fixed and that of $GeH_4$ is adjusted only.

Growth is in condition of:
(1) growth temperature range: 350~650° C., preferably 400° C.
(2) growth gases pressure range: 20~100 m-Torr, preferably 20 m-Torr
(3) species of growth gases: high purity of $SiH_4$ and $GeH_4$.

In addition, further growing a second or a third higher Ge-composition SiGe epitaxial layer being in a thickness of, such as at least 0.1 μm, preferably 0.5~0.8 μm, most preferably 0.8 μm on the first layer subsequently growing a film of Ge on said uppermost epitaxial layer in a thickness of, such as 1 μm. At last, growing a GaAs epitaxial layer by using MOCVD in a thickness of 1~3 μm on said Ge film at 650° C.

During above-mentioned growth cycle, each of epitaxial layers needs in-situ high temperature annealing to further promote the quality of Ge and GaAs epitaxy, i.e., the conditions are a temperature of 650~800° C., preferably 750° C., 0.25 to 1 hour, and at a pressure of 5 to 20 m-Torr using hydrogen as atmosphere of said annealing.

With respect to the growth cycle for Ge epitaxy on Si, the Ge composition of first layer is at least 70%, preferably 70~90%, most preferably 90%, the Ge composition of second layer is ranging within 80~98%, preferably 95%. The growth of third layer is optionally carried out depending upon the growth results of epitaxy, wherein the Ge content is decided between which of second and pure Ge. Of course the uppermost lay is pure Ge, which has almost the same lattice constant as GaAs, thus GaAs epitaxy is grown on Ge film therein and is without mismatch at the interface.

As for best mode of GaAs grown on Ge epitaxy according to the invention, a first layer $Si_{0.1}Ge_{0.9}$ having about 0.8 μm in thickness is obtained in conditions that growth temperature is 400° C., growth gases pressure is 20 m-Torr, and is further in-situ treated by annealing at 750° C., in 15 min. After that, a second layer $Si_{0.05}Ge_{0.95}$ having about 0.8 μm in thickness is formed in conditions that growth temperature is 400° C., growth gases pressure is 20 m-Torr, and is further in-situ treated by annealing at 750° C., in 15 min. In the case of optional third layer which is $Si_{0.02}Ge_{0.98}$ having about 0.8 μm in thickness is also obtained in conditions that growth temperature is 400° C., growth gases pressure is 20 m-Torr, and is treated by annealing at 750° C., in 15 min. At last, uppermost layer which is pure Ge having about 1.0 μm in thickness is formed in conditions that growth temperature is 400° C., growth gases pressure is 20 m-Torr, and is also in-situ treated by annealing at 750° C. in 15 min.

For the purpose of growing GaAs epitaxy on achieved Ge epitaxial layers, it is carried out at 650° C. by using metal organic chemical vapor deposition equipment. The thickness of epitaxial GaAs depends on the device requirement.

What is claimed is:

1. A process for growing a GaAs epitaxial layer on Ge/SiGe/Si substrate comprising steps of:
   (1) providing a clean silicon wafer;
   (2) growing a first SiGe epitaxial layer with a certain thickness, wherein the layer comprises at least 70 wt. % of Ge;
   (3) performing in-situ high temperature annealing for the first layer;
   (4) growing a second and/or an optional third layers wherein the Ge content of the optional third layer is more than that of the second layer, and the Ge content of the second layer is more than that of the first layer, and during each of two growing periods, performing in-situ high temperature annealing for those layers;
   (5) growing a pure Ge film on the epitaxial layer from step (4);
   (6) finally, growing GaAs epitaxy on said Ge film.

2. The process according to claim 1, wherein, in steps (1) to (5), the Ge content of epitaxial layers, from the first layer, the second and/or third layer to a pure Ge film as the topmost layer, is stepwise increasing, and their growth is carried out at a temperature of from 350 to 650° C., growth gases having pressure of from 20 to 100 m-Torr by using ultra-high vacuum chemical vapor deposition; in addition, in step (6), growing for GaAs epitaxy is carried out at a temperature of 600° C. by using metal organic chemical vapor deposition and the growth time depends on the device requirement.

3. The process according to claim 1 or 2, wherein the first SiGe epitaxial layer is $Si_{0.1}Ge_{0.9}$ which has a thickness of at least 0.1 µm.

4. The process according to claim 3, wherein the first SiGe epitaxial layer is $Si_{0.1}Ge_{0.9}$ which has a thickness of 0.5 to 0.8 µm.

5. The process according to claim 1 or 2, wherein the second SiGe epitaxial layer is $Si_{0.05}Ge_{0.95}$ which has a thickness of at least 0.1 µm.

6. The process according to claim 5, wherein the second SiGe epitaxial layer is $S_{i0.05}Ge_{0.95}$ which has a thickness of 0.5 to 0.8 µm.

7. The process according to claim 1 or 2, wherein the optional third SiGe epitaxial layer is $Si_{0.02}Ge_{0.98}$ which has a thickness of at least 0.1 µm.

8. The process according to claim 7, wherein the optional third SiGe epitaxial layer is $Si_{0.02}Ge_{0.98}$ which has a thickness of 0.5 to 0.8 µm.

9. The process according to claim 1, wherein the first SiGe epitaxial layer can comprise 70 to 90 wt. % of Ge.

10. The process according to claim 1, wherein the second SiGe epitaxial layer can comprise 80 to 95 wt. % of Ge.

11. The process according to claim 1, wherein growing for epitaxy layer is carried out at a temperature of 400° C.

12. The process according to claim 1 or 2, wherein in-situ high temperature annealing is performed at a temperature of 750° C. in at least 5 min.

13. The process according to claim 12, wherein the atmosphere of in-situ high temperature annealing is hydrogen with a pressure of 20 m-Torr.

* * * * *